US007002853B2

(12) United States Patent
Kozakai et al.

(10) Patent No.: US 7,002,853 B2
(45) Date of Patent: Feb. 21, 2006

(54) MEMORY CARD HAVING A BUFFER MEMORY FOR STORING TESTING INSTRUCTION

(75) Inventors: Kenji Kozakai, Tachikawa (JP); Yuusuke Jono, Higashiyamato (JP); Motoki Kanamori, Kodaira (JP); Kazunori Furusawa, Kodaira (JP); Atsushi Shikata, Higashimurayama (JP); Yosuke Yukawa, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/874,381

(22) Filed: Jun. 24, 2004

(65) Prior Publication Data

US 2004/0236910 A1 Nov. 25, 2004

Related U.S. Application Data

(63) Continuation of application No. 10/654,957, filed on Sep. 5, 2003.

(30) Foreign Application Priority Data

Feb. 26, 1999 (JP) ............................................. 11-49369

(51) Int. Cl.
*G11C 16/04* (2006.01)

(52) U.S. Cl. .............................. 365/189.03; 365/185.05; 365/189.01

(58) Field of Classification Search ............ 365/189.03, 365/185.05, 189.01
See application file for complete search history.

(56) References Cited

U.S. PATENT DOCUMENTS 4,126,896 A 11/1978 Yamazaki (Continued)

FOREIGN PATENT DOCUMENTS

| JP | 63-311436 | 12/1988 |
|----|-----------|---------|
| JP | 2-64756 | 3/1990 |
| JP | 3-265030 | 11/1991 |
| JP | 11-265283 | 9/1999 |

OTHER PUBLICATIONS

Nikkei Electronics, Apr. 11, 1994.

Mano, M. Morris, Computer System Architecture, 1982, Prentice–Hall, Inc., 2nd ed., pp 159–161, 262–263, 434–443.

Webopedia's definition on the vector, http://www.webopedia.com/term/v/vector.html.

Webopedia's definition on the EEPROM, http://www.webopedia.com/term/E/EEPROM.html.

*Primary Examiner*—Richard Elms
*Assistant Examiner*—Tuan T. Nguyen
(74) *Attorney, Agent, or Firm*—Mattingly, Stanger, Malur & Brundidge

(57) ABSTRACT

A memory card (1) includes an electrically rewritable non-volatile memory (4), a data processor (3) having a function of executing instructions, and managing the allocation of file data in the non-volatile memory, an interface control circuit (2) having a function of establishing an external interface, for controlling the execution of instructions by the data processor in response to external commands and for controlling access to the non-volatile memory and a buffer memory (7) for temporarily storing the file data. The interface control circuit includes command control means for decoding a first command externally supplied and for instructing the data processor to fetch an instruction from the buffer memory and to operate.

33 Claims, 12 Drawing Sheets

U.S. PATENT DOCUMENTS

| | | |
|---|---|---|
| 4,504,915 A | 3/1985 | Daniels et al. |
| 4,760,518 A | 7/1988 | Potash et al. |
| 5,138,619 A | 8/1992 | Fasang et al. |
| RE34,445 E | 11/1993 | Hayes et al. |
| 5,291,603 A | 3/1994 | Morse et al. |
| 5,473,573 A | 12/1995 | Rao |
| 5,535,165 A | 7/1996 | Davis et al. |
| 5,584,044 A | 12/1996 | Gouhara et al. |
| 5,598,368 A | 1/1997 | Takahashi et al. |
| 5,606,660 A | 2/1997 | Estakhri et al. |
| 5,704,058 A | 12/1997 | Derrick et al. |
| 5,802,551 A | 9/1998 | Komatsu et al. |
| 5,887,187 A | 3/1999 | Rostoker et al. |
| 6,000,048 A | 12/1999 | Krishna et al. |
| 6,272,042 B1 | 8/2001 | Kato et al. |
| 6,285,597 B1 * | 9/2001 | Kawahara et al. ..... 365/185.24 |
| 6,438,029 B1 | 8/2002 | Hiraki et al. |
| 6,459,621 B1 | 10/2002 | Kawahara et al. |
| 6,643,725 B1 | 11/2003 | Kozakai et al. |
| 6,661,712 B1 * | 12/2003 | Hiraki et al. .......... 365/189.05 |

\* cited by examiner

EXECUTION OF EXTENDED PROGRAM

EXECUTION OF FIRST TRANSFER CONTROL PROGRAM

EXECUTION OF SECOND TRANSFER CONTROL PROGRAM

FILE DATA WRITING

FILE DATA READING

EXTERNAL TRANSFER OF WORK DATA

TRANSFER OF WORK DATA TO AND FROM FLASH MEMORY

FIG. 15(A)

PROGRAM

| MEMORY CELL | SELECTED/ UNSELECTED | SOURCE | DRAIN | CONTROL GATE |
|---|---|---|---|---|
| Q1 | SELECTED | 0V | 6V | 12V |
| Q2 | UNSELECTED | 0V | 0V | 12V |
| Q3 | UNSELECTED | 0V | 6V | 0V |
| Q4 | UNSELECTED | 0V | 0V | 0V |

FIG. 15(B)

ERASE (POSITIVE VOLTAGE TYPE)

| MEMORY CELL | SELECTED/ UNSELECTED | SOURCE | DRAIN | CONTROL GATE |
|---|---|---|---|---|
| Q1,Q3 | SELECTED | 12V | 0V | 0V |
| Q2,Q4 | UNSELECTED | 0V | 0V | 0V |

FIG. 15(C)

ERASE (NEGATIVE VOLTAGE TYPE)

| MEMORY CELL | SELECTED/ UNSELECTED | SOURCE | DRAIN | CONTROL GATE |
|---|---|---|---|---|
| Q1,Q2 | SELECTED | 5V | 0V | −10V |
| Q3,Q4 | UNSELECTED | 5V | 0V | 0V |

MEMORY CARD HAVING A BUFFER MEMORY FOR STORING TESTING INSTRUCTION

This is a continuation of U.S. Ser. No. 10/654,957, filed Sep. 5, 2003, now abandoned; which is a continuation of U.S. Ser. No. 09/495,955, filed Feb. 2, 2000, now U.S. Pat. No. 6,643,725.

BACKGROUND OF THE INVENTION

1. Field of the Invention

The present invention relates to memory cards such as file memories, and relates to a technique advantageously applied to, for example, a memory card in which functions of a file memory is included on a single chip.

2. Description of the Related Art

A file memory is a memory card capable of storing file data utilizing a technique similar to management of file allocation by using an FAT (file allocation table) in a hard disk. For example, an electrically rewritable flash memory is used as file data storage area in such a file memory. When file data are accessed, the data are temporarily stored in a buffer memory. For example, file data to be written stored in the buffer memory are written in the flash memory after being assigned with an ECC code at an ECC circuit, and file data read from the flash memory and stored in the buffer memory are output to the outside after error check and correction using an ECC code.

A file memory frequently incorporates a data processor such as a microcomputer for purposes including file management and control of access to the buffer memory.

PCMCIA-ATA type flash memory cards which are one type of file memories are described on pages 78 and 79 of "Nikkei Electronics" published on Apr. 11, 1994.

SUMMARY OF THE INVENTION

The inventors have conducted a study on a control program area of a file memory having a data processor. A file memory requires a program for debugging or testing in addition to a program for normal file management. The required programs are normally incorporated in a memory card even when the file memory incorporates a data processor, such as a microprocessor, because such a data processor does not need a function of accessing outside the memory card. The storage capacity of a ROM for storing programs is thus increased by the program for debugging and testing, and the like, which results in a problem in that the scale of the circuit is increased. Especially, the inventor found that a countermeasure is needed when limitations placed upon chip size, and the like, do not allow a random increase of the storage capacity of a ROM in implementing functions of a memory card such as a file memory in the form of a semiconductor integrated circuit by loading them on a single chip.

It is an object of the invention to provide a memory card in which a data processor incorporated therein can be caused to execute new programs for purposes including testing or debugging without adding a separate program memory.

The above and other objects and novel features of the invention will become apparent from the description of this specification and the accompanying drawings.

Typical aspects of the invention disclosed in this application can be summarized as follows.

There is provided a memory card 1 comprising an electrically rewritable non-volatile memory 4, a data processor 3 having a function of executing instructions capable of managing the allocation of file data in the non-volatile memory, an interface control circuit 2 having a function of establishing external interface, for controlling the execution of instructions by the data processor in response to external commands and for controlling access to the non-volatile memory and a buffer memory 7 for temporarily storing the file data, in which the buffer memory can be used also as a program memory. Specifically, there is provided command control means 24, 26 for decoding a first command CMD1 supplied from the outside and for instructing the data processor to fetch an instruction from the buffer memory and to operate. This makes it possible to cause the integrated data processor to execute new programs for purposes including testing or debugging without adding a separate program memory.

Interrupt may be used as a method of control for causing the data processor to execute a program PGM1 stored in the buffer memory. In this case, the command control means may employ a configuration in which an interrupt is requested to the data processor and a first cause of interrupt is notified to the same by decoding the first command.

When vector control is used as a method for controlling the interrupt, the data processor includes a central processing unit 30 capable of responding to an interrupt by transferring the process to an instruction address indicated by a vector retrieved from a vector table 340 according to the cause of interrupt and a ROM 34 to be accessed by the central processing unit. The ROM 34 includes the vector table 340 and a program area 341, and the vector table includes a first vector VCT1 associated with the first cause of interrupt. Thus, the central processing unit can execute an instruction from the beginning of the program in the buffer memory indicated by the first vector.

The program PGM1 may be transferred to the buffer memory from the outside or from the integrated flash memory. The usability of the file memory is improved by allowing the file memory to transfer the program to the buffer memory by itself. For example, when the program PGM1 is allowed to be stored in the buffer memory from the outside of the file memory, the command control means further requests the data processor an interrupt and notifies it of a second cause of interrupt by decoding a second command CMD2 supplied from the outside. The vector table in the ROM further includes a second vector VCT2 that responds to the second cause of interrupt. The program area of the ROM further includes a transfer control program PGM2 for storing the externally supplied program in the buffer memory starting from a first address thereof. In this case, the second vector is information indicating the leading address of the transfer control program, and the first address is an address that coincides with the address indicated by the first vector VCT1.

When the program PGM1 is allowed to be stored in the buffer memory from the non-volatile memory incorporated in the file memory, the command control means further requests the data processor an interrupt and notifies the same of a third cause of interrupt by decoding a third command CMD3 supplied from the outside. The vector table in the ROM further includes a third vector VCT3 that responds to the third cause of interrupt. The program area of the ROM further includes a transfer control program PGM3 for storing the program supplied from the non-volatile memory in the buffer memory starting from the first address thereof. In this case, the third vector is information indicating the leading address of the transfer control program, and the first address is an address that coincides with the address indicated by the first vector.

In the memory card 1 constituted by a single chip, even when a random increase of the storage capacity of the ROM is inhibited by limitations on the chip size and the like, the programs for purposes including debugging or testing can be executed within the limitations.

BRIEF DESCRIPTION OF THE DRAWINGS

FIGS. 15A, 15B and 15C illustrate examples of conditions for voltages for erase and write operations on flash memory cells.

DESCRIPTION OF THE PREFERRED EMBODIMENTS

[Summary of Memory Card LSI]

Figure 1:
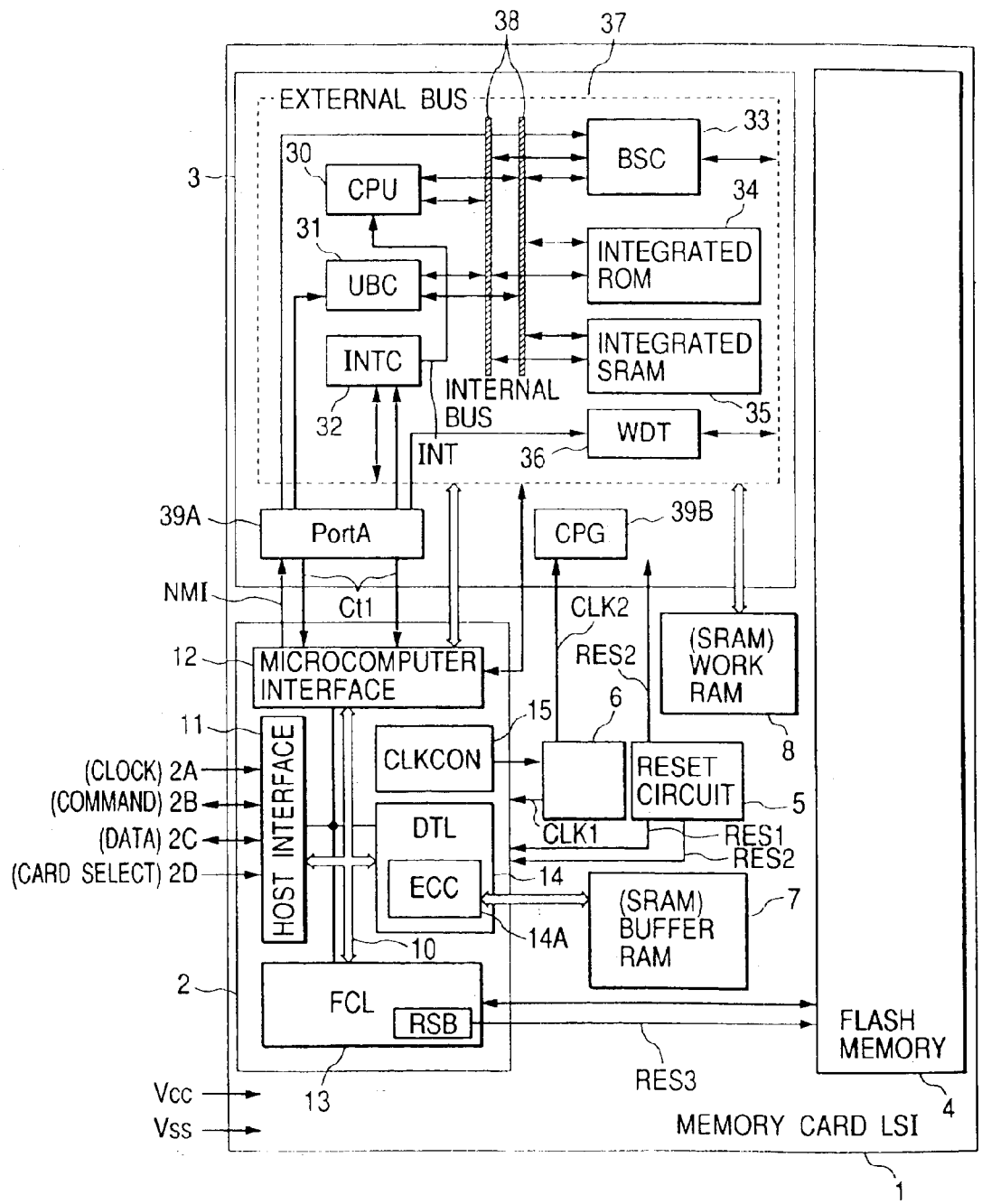
FIG. 1 is a block diagram of a memory card LSI which is an example of a memory card according to the invention.

FIG. 1 shows a semiconductor integrated circuit for a memory card according to an embodiment of the invention. The illustrated semiconductor integrated circuit may be regarded as a system-on-chip type LSI (semiconductor integrated circuit) that constitutes a minimum unit of a file memory and is formed on a single semiconductor substrate (chip) such as single crystal silicon, although this is not limiting the invention.

A semiconductor integrated circuit (also simply referred to as "memory card LSI") 1 shown in FIG. 1 has an interface control circuit 2, a microcomputer 3 which is an example of a data processor, a flash memory 4 which is an example of an electrically rewritable non-volatile memory, a reset circuit 5, a clock oscillation circuit 6 utilizing an oscillator, a buffer RAM 7 and a work RAM 8.

A power supply voltage Vcc and a ground voltage Vss are externally input to the memory card LSI 1 as operating power supplies. The input power supply voltage Vcc and ground voltage Vss are supplied to each of the above-described circuits.

The interface control circuit 2 has a host interface circuit (Host I/F) 11, a microcomputer interface (Micro I/F) 12, a file control logic (FCL) 13 and a data transfer logic (DTL) 14 which are connected each other by a bus 10.

A clock signal (Clock) 2A and a card select signal (Card Select) 2D are externally input to the host interface circuit 11, and a command (Command) 2B and data (Data) 2C are input to and output from the same. Each of the command 2B and data 2C is input and output on a bit serial basis, although this is not limiting the invention. The host interface circuit 11 accepts the externally supplied command 2B and decodes it to instruct operations of the microcomputer 3 and flash memory 4 and to control file data access to the flash memory 4.

The instruction of an operation of the microcomputer 3 is performed by supplying an interrupt signal NMI and a cause of interrupt from the host interface circuit 11 to the microcomputer 3 through the microcomputer interface 12. The microcomputer interface 12 exchanges the interrupt signal NMI, a control signal Ctl and various data such as data information and control information with the microcomputer 3.

The file control logic 13 controls file data access to the flash memory 4 according to the result of command decoding at the host interface circuit 11 under control of the microcomputer 3.

The buffer RAM 7 is used as a file data buffer memory for temporarily storing file data externally supplied to the host interface circuit 11 or temporarily storing file data read from the flash memory 4. It is also used as an extended program memory for the microcomputer 3.

The control over access to the buffer RAM 7 is carried out through the data transfer logic 14. The data transfer logic 14 has an ECC circuit 14A to check and correct errors during access to the buffer RAM 7 with the ECC circuit.

When the buffer RAM 7 is used as a file data buffer memory, in a file data writing operation, the file data are read by the data transfer logic 14 from the buffer RAM 7 on to the bus 10, and the read file data are written in the flash-memory 4 under control of the file control logic 13. In a file data reading operation, the file data are read from the flash memory 4 on to the bus 10 under control of the file control logic 13, and the read file data are written in the buffer RAM 7 under control of the file transfer logic 14. The state in which the buffer RAM 7 is used as a buffer memory for file data is achieved when a file access command is externally supplied to the interface control circuit 2; an interrupt according to the result of decoding of the command is accepted by the microcomputer; and the result of the decoding of the command is supplied to the file control logic 13 and file transfer logic 14.

The buffer RAM 7 is mapped to an address space of the microcomputer 3 (more particularly, a CPU 30 to be described later). The microcomputer 3 can access the buffer RAM 7 similarly to access to the work RAM 8 through the data transfer logic 14. For example, this mode of access is enabled when the buffer RAM 7 is used as an extended program memory of the microcomputer 3. The state in which the microcomputer 3 utilizes the buffer RAM 7 as an extended program memory is realized when an external command for the execution of an extended program is supplied to the interface control circuit 2 and an interrupt according to the result of decoding of the command is accepted by the microcomputer 3. This process will be detailed later.

The file memory LSI 1 has a file data access system which is compatible with a hard disk apparatus, although this is not limiting the invention. For example, one cluster which is a unit area for access management includes four sectors, and a management area is allocated to each of the clusters. A management area has pointer information for determining the arrangement of clusters forming a file, information on the number of rewrites, information identifying good and defective sectors and the like. Further, the flash memory 4 has a directory area that identifies the file name of a file stored therein and the leading cluster of the same.

In order to manage the arrangement of file data in clusters in the flash memory 4, the microcomputer 3 generates a management table in the integrated SRAM 35 based on information of the management areas and directory area. The microcomputer 3 controls the generation and update of the management table and generates information specifying a management unit area to be accessed at access to file data using the management table. The information for controlling access to file data is supplied to the file control logic 13 through the microcomputer interface 12.

The microcomputer 3 has a central processing unit (CPU) 30, an integrated ROM (read only memory) 34 in which an operation program of the CPU 30 and the like are stored, an integrated SRAM (static random access memory) 35 used as a work area of the CPU 30 or an area for temporarily storing data, a bus controller (BSC) 33 for controlling the bus cycle of an external bus 37 when the CPU 30 accesses an external address space and a user break controller (UBC) 31 for supporting debugging such as breakpoint control, which are each connected to an internal bus 38. An interrupt signal NMI and a cause of interrupt are input to an interrupt control circuit (INTC) 32 which in turn requests the CPU 30 an interrupt by performing interrupt priority control. An interrupt processing program is stored in the integrated ROM 34, although this is not limiting the invention.

A watch dog timer (WDT) 36 for monitoring the run away of the CPU 30 and the like is connected to the external bus 37 of the microcomputer 3 in addition to the bus controller 33. Further, the work RAM 8 and microcomputer interface 12 are connected through the bus. The microcomputer 3 has one I/O port 39A as another interface circuit. The I/O port 39A is exclusively used for inputting the interrupt signal NMI and outputting control signals represented by the control signal Ctl. No general purpose I/O is provided, although this is not limiting the invention.

The microcomputer 3 has a sleep mode and a standby mode as low power consumption modes, although this is not limiting the invention. The CPU 30 executes a sleep instruction when a standby control bit provided in a control register (not shown) has a first logical value to enter the sleep mode. In the sleep mode, the CPU 30 stops operating with the state of the register and the like kept unchanged. Peripheral circuits continue operating. The sleep mode is cancelled by an interrupt or reset. The CPU 30 executes a sleep instruction-when the standby control bit provided in the control register has a second logical value to enter the standby mode. In the standby mode, the CPU 30 stops operating with the. state of the register and the like kept unchanged, and the peripheral circuits also stop operating. The standby mode is canceled by an interrupt or reset.

A clock signal CLK2 is supplied from the oscillation circuit 6 to a clock pulse generator 39B of the microcomputer 3. For example, when the microcomputer 3 is set in the standby mode, the oscillation circuit 6 stops outputting the clock signal CLK2 according to a signal output by the microcomputer 3 in response. When the interrupt signal NMI is asserted from the microcomputer interface 12 to the port 39A in this state, the clock control circuit 15 detects the same state. Accordingly, the clock control circuit 15 causes the oscillation circuit 6 to resume the supply of the clock signal CLK2. Therefore, when the CPU 30 responds to the interrupt, the microcomputer 3 can leave the standby mode because supply of the clock signal CLK2 has already been resumed by then.

The reset circuit 5 resets the interface control circuit 2 with a reset signal RES1 and resets the microcomputer 3 with a reset signal RES2. The flash memory 4 is reset by a reset signal RES3 which is controlled according to the value of a reset enable bit RSB provided in a control register in the file control logic (FCL) 13.

Figure 2:
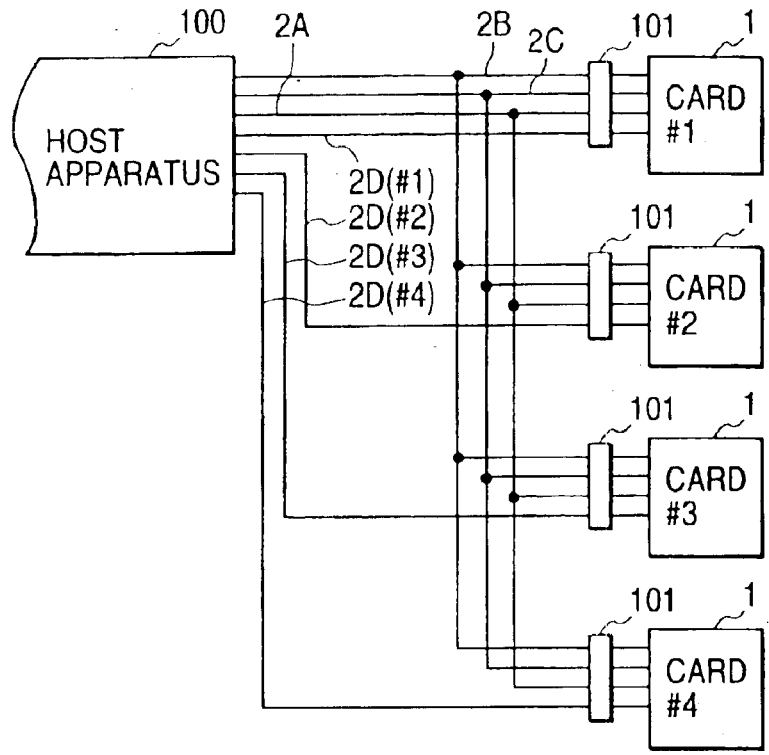
FIG. 2 is a block diagram of an example of a data processing system that utilizes a card select signal unique to each memory card LSI.
Figure 3:
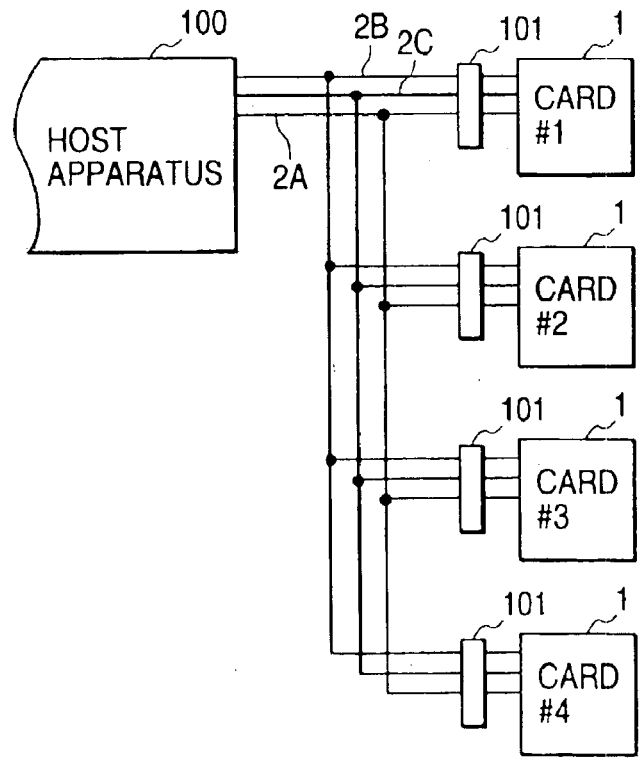
FIG. 3 is a block diagram of an example of a data processing system that utilizes card addresses transmitted along with commands.

FIGS. 2 and 3 show examples of a data processing system utilizing memory card LSIs 1 as described above. Although not shown, the memory card LSIs 1 are packaged using a technique such as resin molding with connectors thereof exposed. 100 represents a host system, and 101 represents slots for mounting the memory cards. FIGS. 2 and 3 illustrate configurations to allow a plurality of memory card LSIs 1 to be mounted at a time. The clock signal line 2A, command signal line 2B and data signal line 2C are shared by the memory card LSIs 1 in both of the configurations. The selection of the plurality of memory card LSIs 1 mounted is carried out using the card select signal 2D specific to each of the memory card LSIs 1 in the example in FIG. 2 and using card addresses transmitted along with commands in the example in FIG. 3. In the example in FIG. 3, a memory card LSI 1 recognizes that it has been selected upon the input of a card address allocated to it at an initializing operation.

Figure 4:
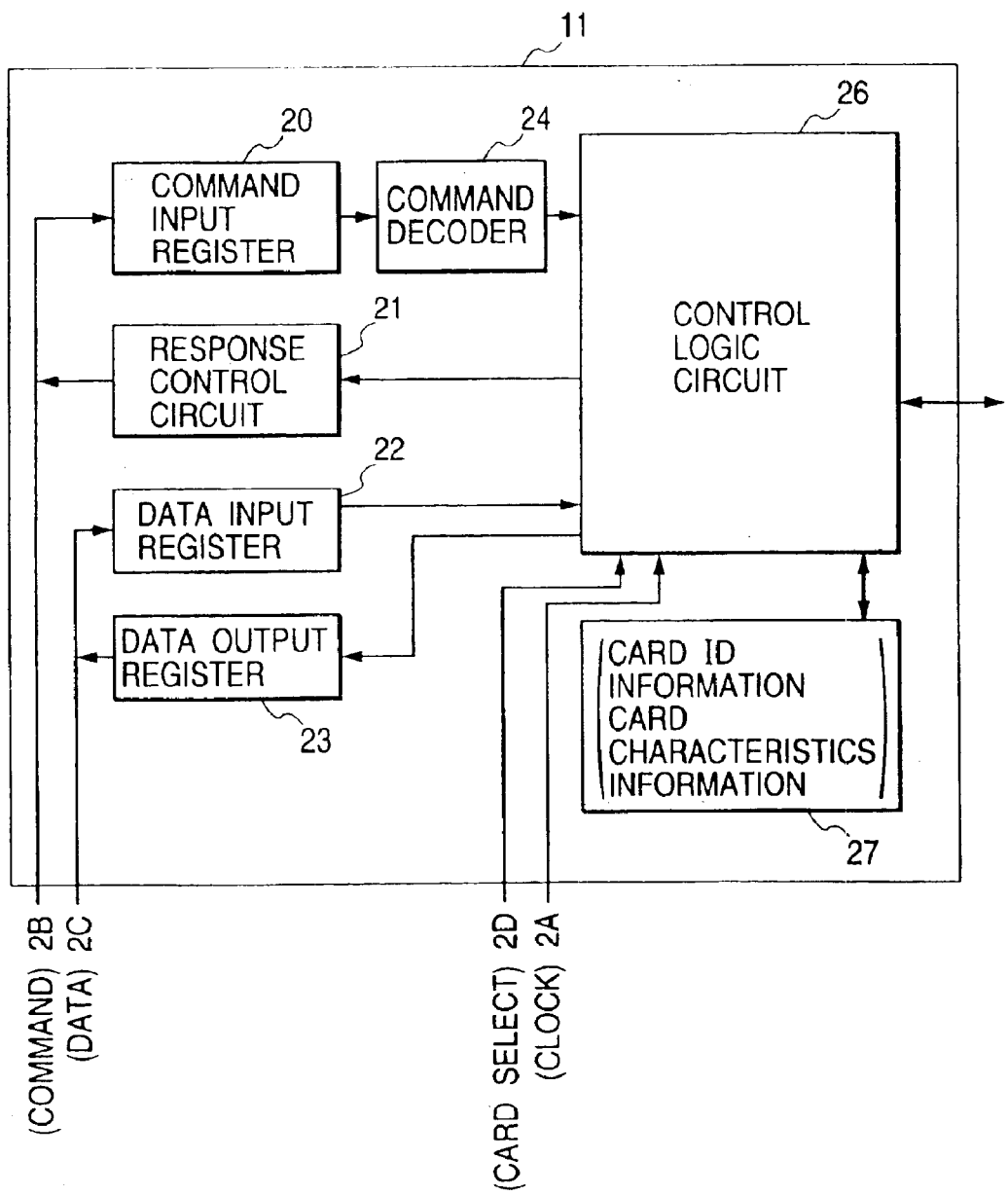
FIG. 4 is a block diagram of an example of a host interface circuit.

FIG. 4 is a block diagram of the host interface circuit 11. Referring to FIG. 4, the host interface circuit 11 has a command input register 20 to which the command 2B is input, a response control circuit 21 for responding to the input of commands, a data input register 22 to which data 2C are input and a data output register 23 for outputting the data 2C. An input command is decoded by a command decoder 24 and, in accordance with the result of the decoding, a control logic circuit 26 controls interrupts to the microcomputer 3, data input and output, responses to a host apparatus and the like. 27 represents a memory for temporary storage used by the control logic 26.

[Execution of Extended Program]

Next, said buffer RAM7 will be described usable constraction as said extended program memory in detail.

For example, an extended program is executed using vector type interrupt control performed by the microcomputer 3. The vector interrupt of the microcomputer 3 is performed as follows. Specifically, the microprocessor 3 is notified of an interrupt by an interrupt signal NMI from the interface control circuit 2. The interrupt control circuit 32 performs interrupt priority control and the like on the interrupt initiated by the interrupt signal NMI and asserts an interrupt request signal INT to the CPU 30 when the interrupt is accepted. When the interface control circuit 2 detects the acceptance of the interrupt, it supplies information specifying a cause of the interrupt to the external bus 37 through the microcomputer interface 12. The CPU 30 retrieves a vector associated with the cause of interrupt from the vector table. The CPU 30 proceeds to an instruction address indicated by the retrieved vector and branches to a process of responding to the interrupt. In the case of an interrupt for which the process is to return to the state immediately preceding the interrupt after the process of responding to the interrupt, the state is obviously saved before the process of responding to the interrupt.

Figure 5:
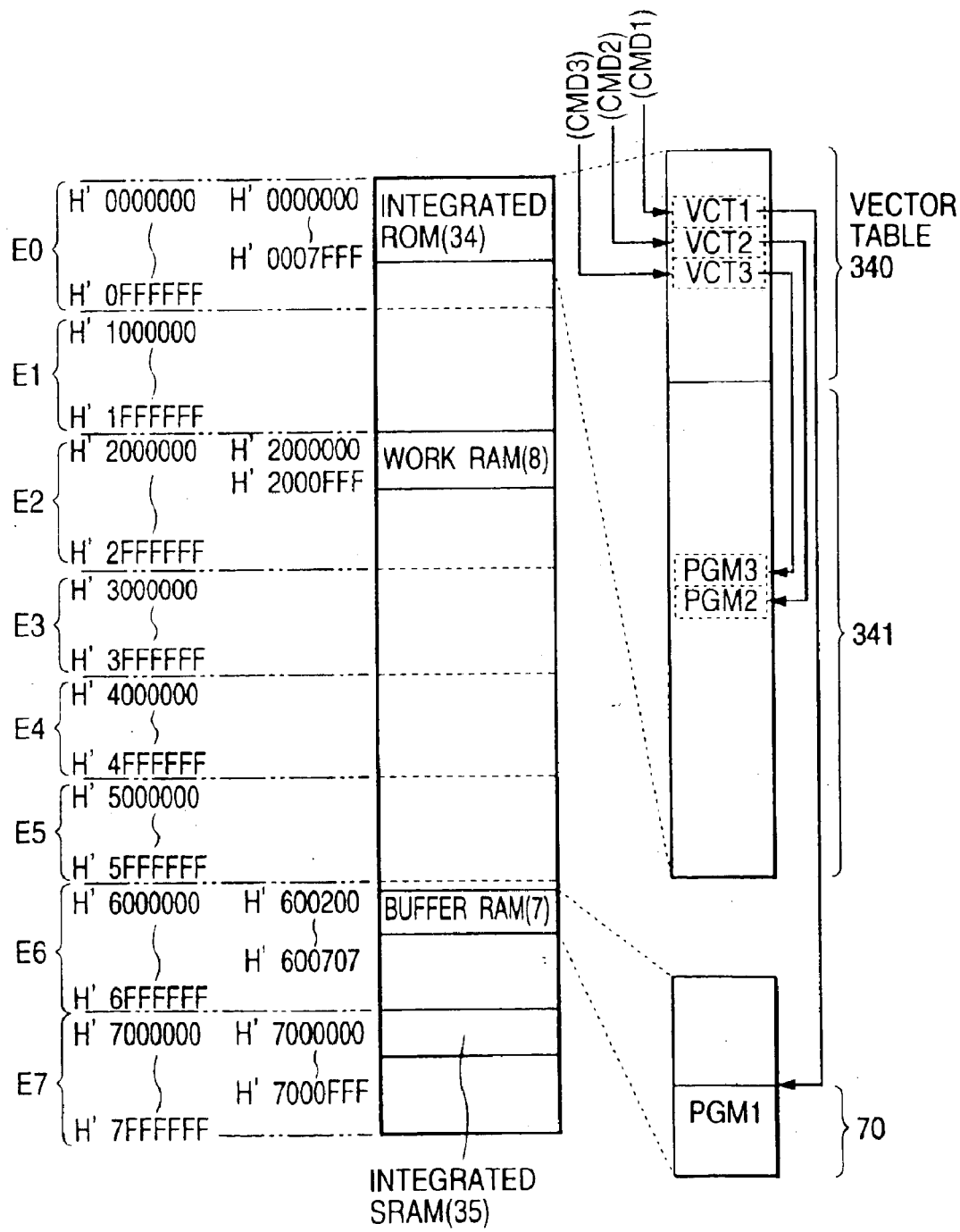
FIG. 5 illustrates vectors maintained by a ROM and a programmable area of a buffer RAM along with a CPU address map.

FIG. 5 shows mapping of the addresses of the integrated ROM 34, work RAM 8, buffer RAM 7 and integrated SRAM 35 to an address space which can be managed by the CPU 30.

A part of the buffer RAM 7 is an area 70 which can be used also as an extended program memory (programmable area), although this is not limiting the invention. A program stored in the programmable area 70 is referred to as "extended program PGM1".

The integrated ROM 34 has the vector table 340 and program area 341. The vector table 340 typically has a first vector VCT1, a second vector VCT2 and a third vector VCT3. The program area 341 has a first transfer control program PGM2 and a second transfer program PGM3 as subroutines. Programs for a reset process, file managing process and the like are also stored, although not shown.

The vector VCT1 has information on the leading address of the programmable area 70. The extended program PGM1 is stored starting from the leading address of programmable area 70. The vector VCT2 has information on the leading address of the storage area of the first transfer control program PGM2. The vector VCT3 has information on the leading address of the storage area of the second transfer control program PGM3.

The first transfer control program PGM2 is a transfer control program for storing an extended program PGM1 externally supplied to the memory card LSI 1 in the programmable area 70 starting from the leading address of the same. The second transfer control program PGM3 is a transfer control program for reading an extended program PGM1 which has been transferred to the flash memory 4 in the form of a file or which has been stored therein in advance at a manufacturing step and for storing the same in the programmable area 70 starting from the leading address thereof.

Figure 6:
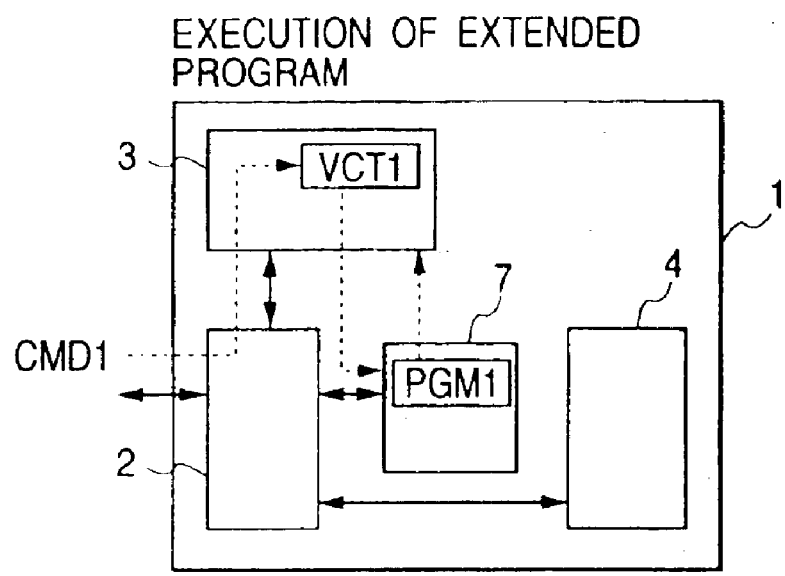
FIG. 6 illustrates an example of a state of execution of an extended program.

FIG. 6 schematically shows a process of executing an extended program PGM1 stored in the programmable area 70. The execution of the extended program PGM1 stored in the programmable area 70 is instructed by an extended program execution command CMD1 externally supplied to the interface control circuit 2. When the extended program execution command CMD1 is input to the command input register 24 of the interface control circuit 2, the command decoder 24 decodes the same and, upon receipt of the result of the decoding, the control logic circuit 26 outputs an interrupt signal NMI and notifies the CPU 30 of a first cause associated with the extended program execution command. After performing a required state saving process and the like, the CPU 30 retrieves a first vector VCT1 associated with the first cause from the vector table 340 and proceeds to the execution of the extended program PGM1 in the programmable area 70.

Figure 7:
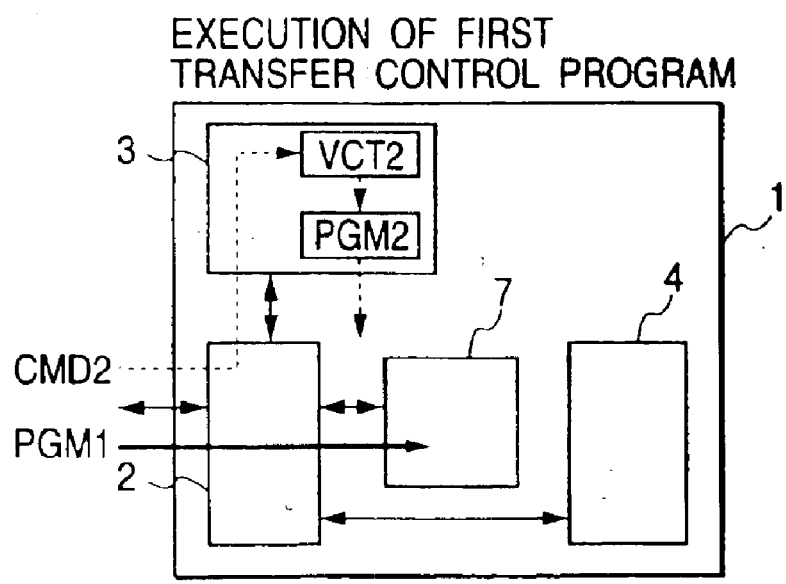
FIG. 7 illustrates a state of execution of a first transfer control program for storing an external extended program in a buffer RAM.

FIG. 7 schematically shows a process of executing the first transfer control program PGM2. The execution of the first transfer control program PGM2 is instructed by an external transfer control execution command CMD2 for an extended program externally supplied to the interface control circuit 2. When the external transfer control execution command CMD2 for an extended program is input to the command input register 20 of the interface control circuit 2, the command decoder 24 decodes the same and, upon receipt,of the result of the decoding, the control logic circuit 26 outputs an interrupt signal NMI and notifies the CPU 30 of a second cause associated with the external transfer control execution command. After performing a required state saving process and the like, the CPU 30 retrieves a second vector VCT2 associated with the second cause from the vector table 340 and proceeds to the execution of the first transfer control program PGM2.

Figure 8:
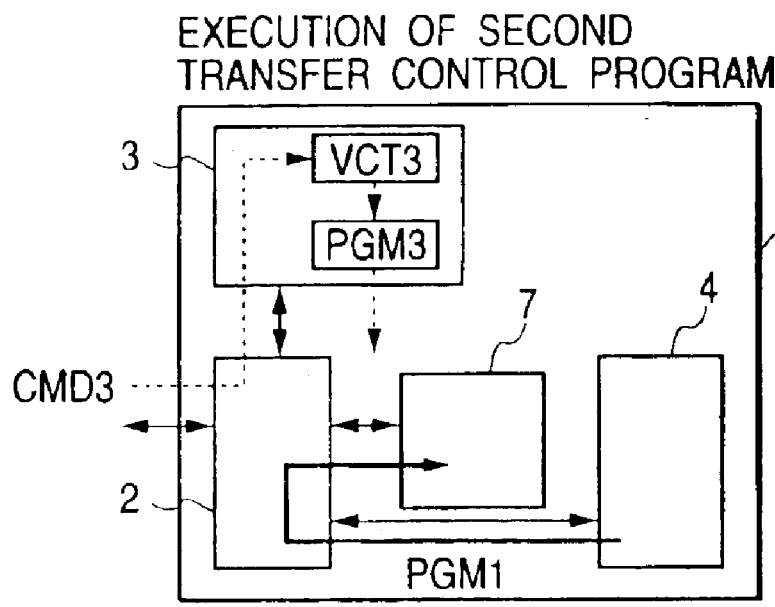
FIG. 8 illustrates a state of execution of a second transfer control program for storing an extended program from a flash memory in a buffer RAM.

FIG. 8 schematically shows a process of executing the second transfer control program PGM3. The execution of the second transfer control program PGM3 is instructed by an internal transfer control execution command CMD3 for an extended program externally supplied to the interface control circuit 2. When the internal transfer control execution command CMD3 for an extended program is input to the command input register 24 of the interface control circuit 2, the command decoder 24 decodes the same and, upon receipt of the result of the decoding, the control logic circuit 26 outputs an interrupt signal NMI and notifies the CPU 30 of a third cause associated with the internal transfer control execution command. After performing a required state saving process and the like, the CPU 30 retrieves a third vector VCT3 associated with the third cause from the vector table 340 and proceeds to the execution of the second transfer control program PGM3.

As described above, it is possible to cause the CPU 30 to execute separate programs for purposes including testing or debugging using the buffer RAM 7 without any additional program memory. In the memory card LSI 1 constituted by a single chip, even when a random increase of the storage capacity of the ROM 34 is inhibited by limitations on the chip size and the like, the programs for purposes including debugging or testing can be executed within the limitations. Further, referring to control over the transfer of an extended program PGM1 to the buffer RAM 7, since the transfer of an extended program PGM1 externally supplied or stored in the integrated flash memory 4 can be controlled by the file memory 1 itself, the file memory 1 has preferable usability with respect to an extended program.

Figure 9:
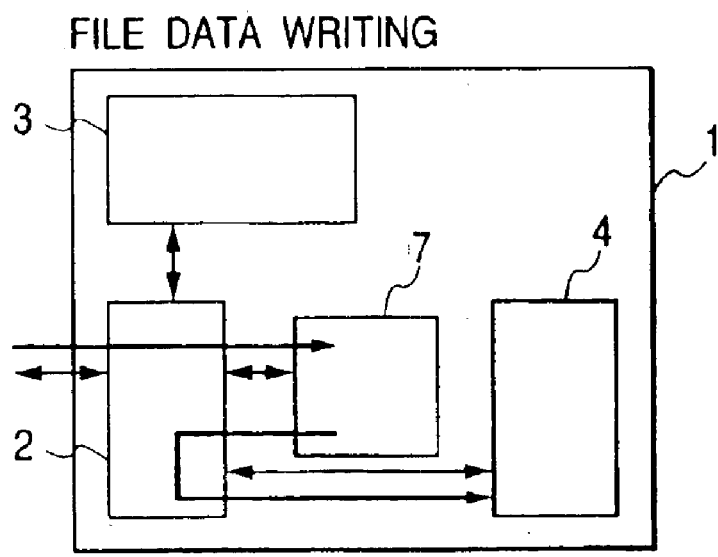
FIG. 9 illustrates a flow of data during a write of file data into a flash memory using a buffer RAM as a data buffer.
Figure 10:
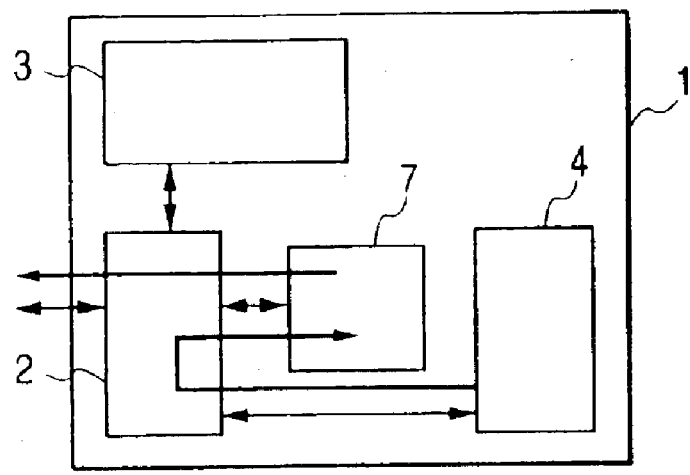
FIG. 10 illustrates a flow of data during a read of file data from a flash memory using a buffer RAM as a data buffer.
Figure 11:
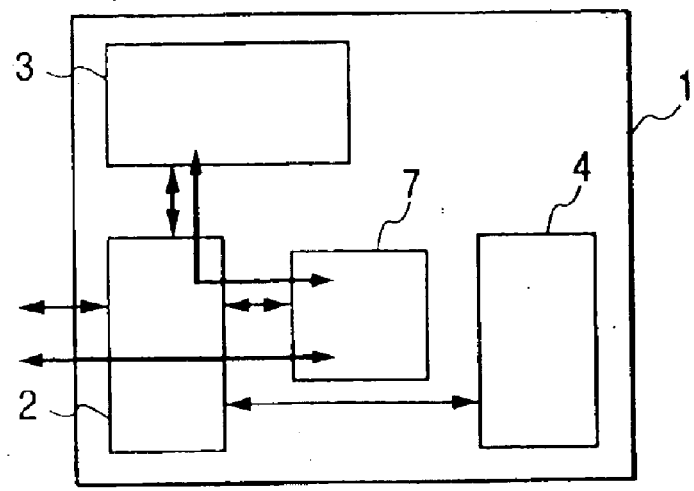
FIG. 11 illustrates a flow of data during input and output of work data to and from a CPU using a buffer RAM as a data buffer.
Figure 12:
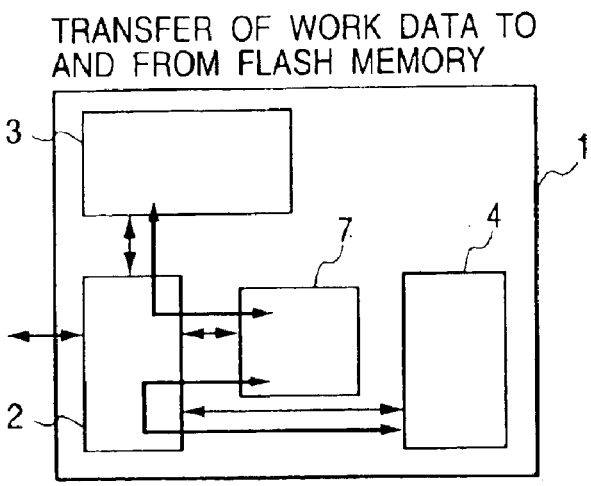
FIG. 12 illustrates a flow of data during input and output of work data between a CPU and a flash memory using a buffer RAM as a data buffer.

As described above, other modes of data transfer using the buffer RAM 7 include modes of utilization inherent in a file memory in which it is used as a data buffer when file data are written in the flash memory 4 (FIG. 9) and in which it is used as a data buffer when file data held in the flash memory 4 are read out (FIG. 10). There are other modes of utilization of the buffer RAM 7 in which it is used as a data buffer when work data are input and output to and from the CPU 30 as shown in FIG. 11 and in which it is used as a data buffer when work data are exchanged between the CPU 30 and the flash memory 4 as shown in FIG. 12.

[Memory]

An example of the flash memory 4 will now be described for reference. First, a description will be made with reference to FIGS. 13A and 13B on a principle of the storage of information in the flash memory.

Figure 13A:
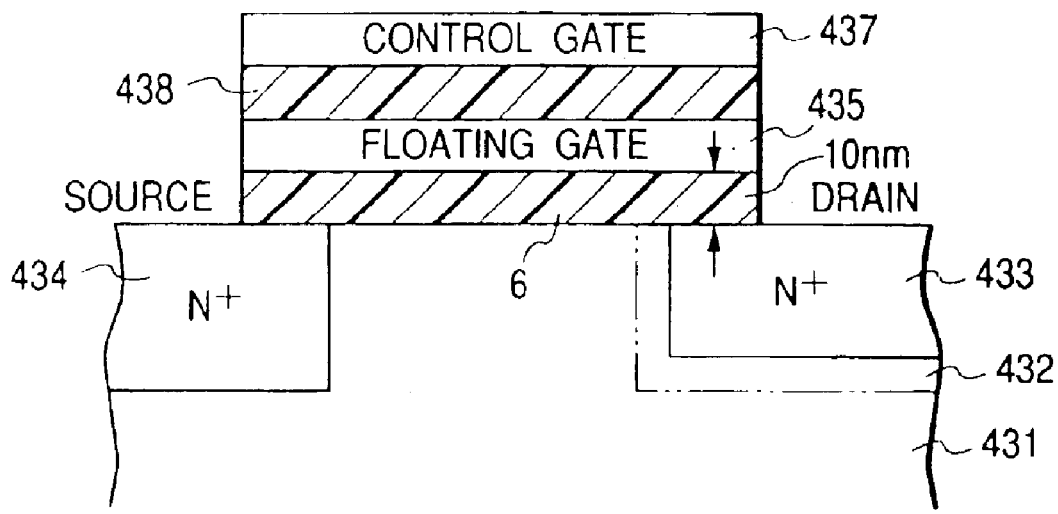
FIG. 13 illustrates a principle of information storage in a flash memory.

The memory cell shown in FIG. 13A as an example is constituted by an insulated gate type field effect transistor having a double layer gate structure. In FIG. 13A, 431 represents a p-type silicon substrate; 432 represents a p-type semiconductor region formed on said silicon substrate 431; and 433 and 434 represent n-type semiconductor regions. 435 represents a floating gate formed above the p-type silicon substrate 431 with a thin oxide film 436 (having a thickness of, for example, 10 nm) as a tunnel insulation film interposed therebetween, and 437 represents a control gate formed above the floating gate 435 with an oxide film 438 interposed therebetween. The source is constituted by the region 434, and the drain is constituted by the regions 433 and 432. Information stored in this memory cell is held in the transistor substantially as a change in a threshold voltage. In the following description, a transistor of a memory cell for storing information (hereinafter also referred to as "memory cell transistor") is of the n-channel type unless otherwise specified.

Figure 13B:
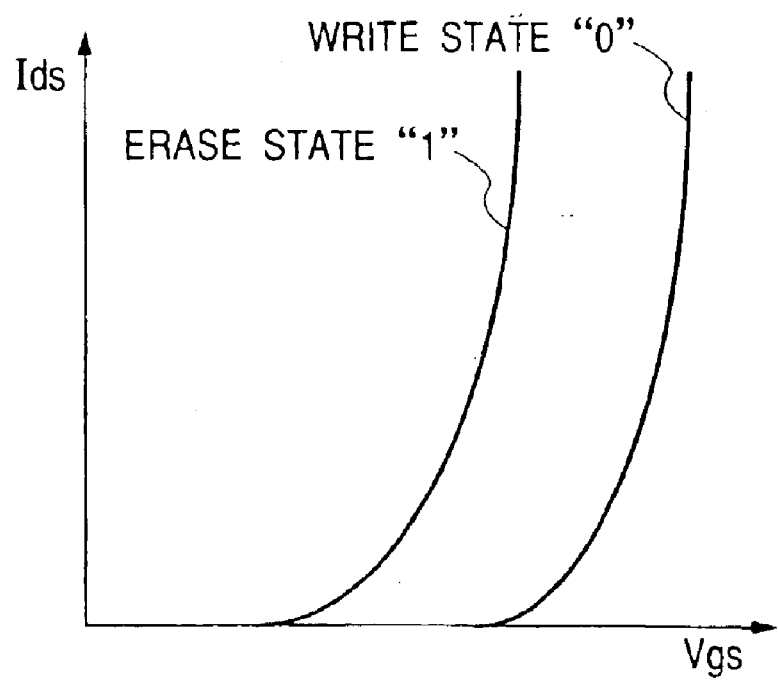

For example, an operation of writing information in a memory cell is carried out by applying a high voltage to the control gate 437 and the drain and by injecting electrons into the floating gate 435 from the drain side using avalanche injection. As a result of the write operation, as shown in FIG. 13B, the threshold voltage of the storage transistor as viewed from the control gate 437 becomes higher than that of a storage transistor in an erase state which has not been subjected to a write operation.

For example, an erase operation is carried out by applying a high voltage to the source and by extracting electrons from the floating gate 435 toward the source using the tunnel phenomenon. Shown in FIG. 13B, the threshold voltage of the storage transistor as viewed from the control gate 437 becomes lower by erase operation. As shown in FIG. 13B, the threshold voltage of a memory cell transistor is a positive voltage level in both of the write and erase states. Specifically, the threshold voltage in the write state is higher than a word line selection level supplied from a word line to the control gate 437, and the threshold voltage in the erase state is lower than the same. Since such a relationship exists between the two threshold voltages and the word line selection level, the memory cell can be constituted by a single transistor without using a selection transistor. Since stored information is electrically erased by extracting electrons accumulated in the floating gate 435 toward the source electrode, a continuous erase operation for a relatively long time will extract electrons in a quantity larger than that of the electrons injected into the floating gate 435 at the write operation. Therefore, when an over-erase is performed in which an electrical erase is continued for a relatively long time, the threshold voltage of the memory cell transistor becomes, for example, a negative level, which results in a problem in that selection occurs in spite of the fact that the word line is at an unselect level. Writing may be carried out utilizing a tunnel current similarly to erasing.

During a read operation, in order to prevent a weak write in the memory cell or unwanted injection of the carrier into the floating gate 435, the voltage applied to the drain and the control gate 437 is limited to a relatively small value. For example, a low voltage on the order of 1 V is applied to the drain, and a low voltage on the order of 5 V is applied to the control gate 437. The magnitude of the channel current flowing through the memory cell transistor is detected by applying those voltages to allow the information stored in the memory cell to be determined as "0" or "1".

Figure 14:
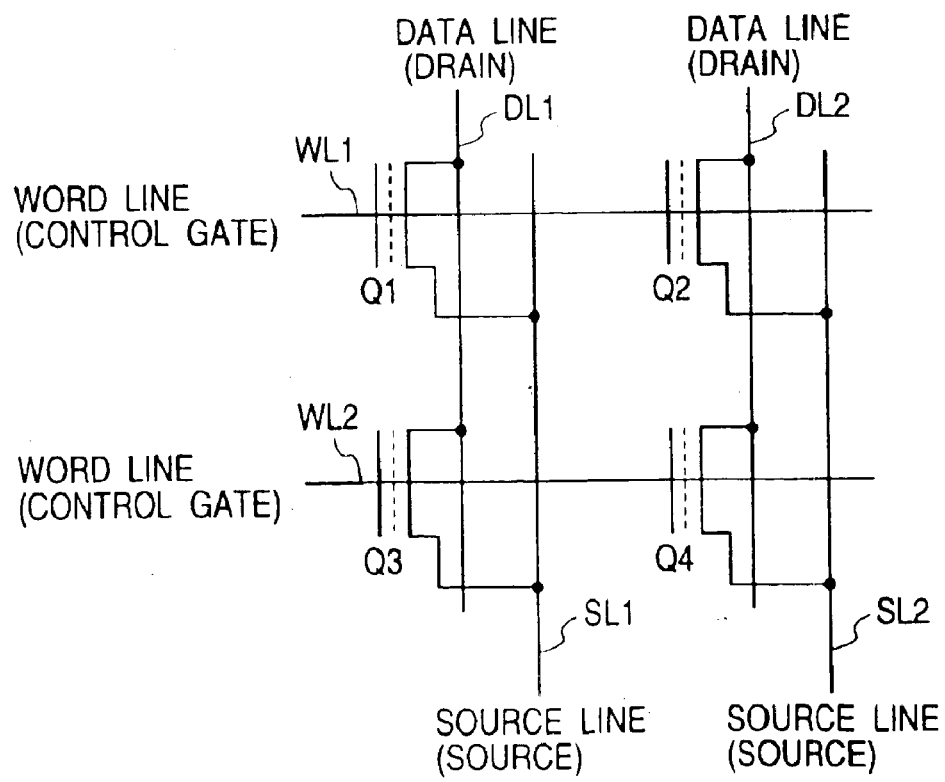
FIG. 14 is a circuit diagram of a memory cell array utilizing flash memory cell transistors showing a principle of the configuration thereof.

FIG. 14 shows a principle of the configuration of a memory cell array utilizing memory cell transistors as described above. FIG. 14 shows four typical memory cell transistors Q1 through Q4. In the memory cells arranged in X- and Y-directions in the form of a matrix, the control gates of the memory cell transistors Q1 and Q2 (Q3 and Q4) arranged on the same row (selection gates of the memory cells) are connected to a respective word lines WL1 (WL2), and the drain regions of the storage transistors Q1 and Q3 (Q2 and Q4) arranged on the same column (input/output nodes of the memory cells) are connected to a respective data line DL1 (DL2). The source regions of the storage transistors Q1 and Q3 (Q2 and Q4) are coupled to a source line SL1 (SL2).

FIGS. 15A, 15B and 15C show examples of conditions for voltages for the erase and write operations on the memory cells. In those figures, the memory elements are the memory cell transistors, and the gates are the control gates as the selection gates of the memory cell transistors. In those figures, erasure based on a negative voltage method is carried out by applying a negative voltage, e.g., −10 V to the control gate to generate a high electrical field required for erasure. As apparent from voltage conditions shown in the figures, erasure based on a positive voltage method allows at least memory cells whose sources are commonly connected to be erased at a time. Therefore, when the source lines SL1 and SL2 are connected in the configuration in FIG. 14, the four memory cells Q1 through Q4 can be erased at a time. According to a source line division method, data lines may serve as units (common source lines extend in the direction of data lines) as typically illustrated in FIG. 14 or word lines may alternatively serve as units (common source lines extend in the direction of source lines). Erasure based on the negative voltage method allows memory cells whose control gates are commonly connected to be erased at a time.

Figure 16:
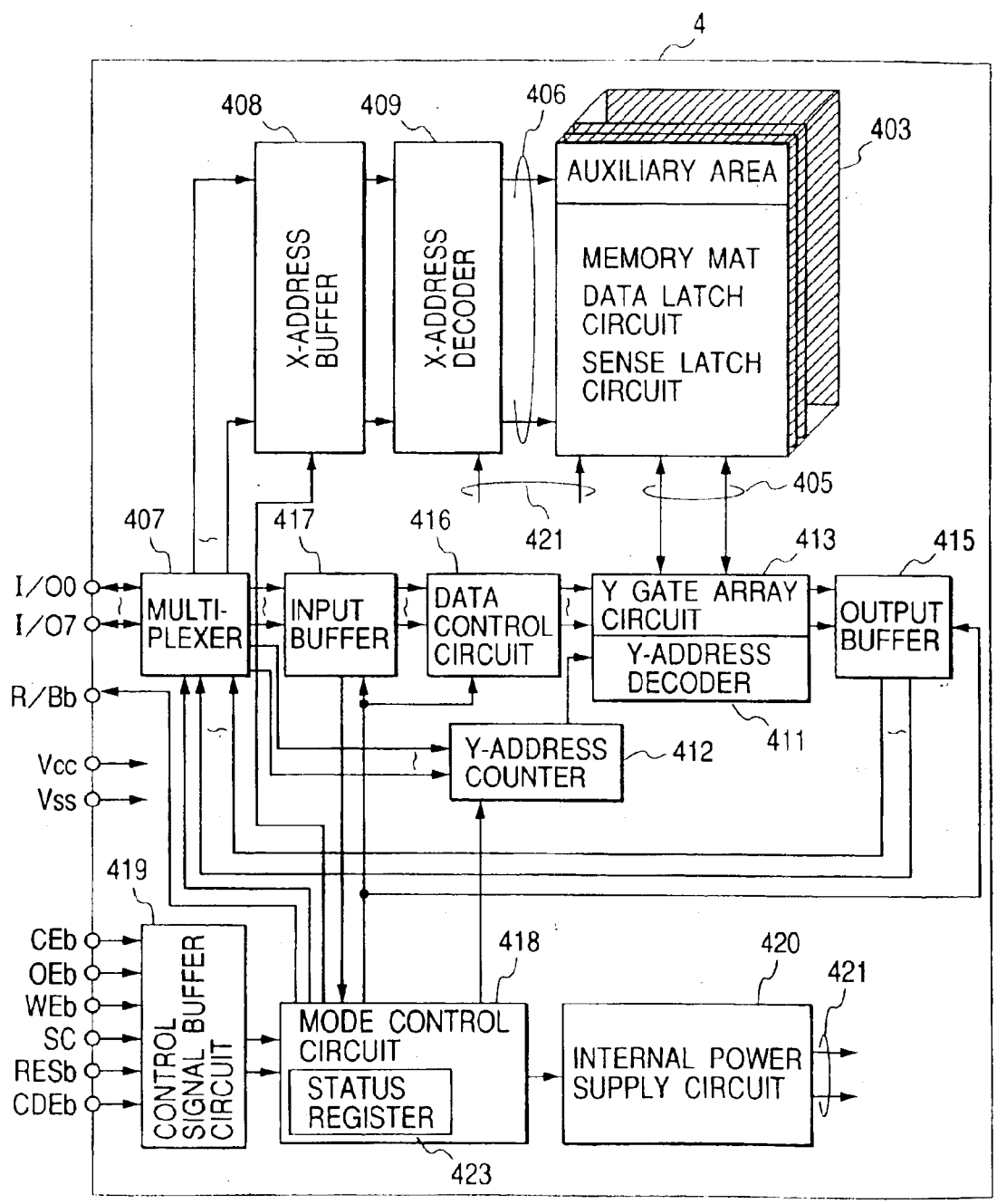
FIG. 16 is a block diagram of an example of flash memory.

FIG. 16 shows an example of the flash memory 4. In FIG. 16, 403 represents a memory array which has memory mats and sense latch circuits. The memory mat has a multiplicity of non-volatile memory cell transistors which can be electrically erased and written. For example, the memory cell transistors have a configuration including a source and a drain formed on a semiconductor substrate or in a memory well, a floating gate formed in a channel region with a tunnel oxide film interposed and a control gate overlaid on the floating gate with a layer insulation film interposed as described with reference to FIG. 13. The control gates are connected to word lines 406; the drains are connected to bit lines 405; and the sources are connected to source lines which are not shown.

External input/output terminals I/O0 through I/O7 are also used as address input terminals, data input terminals, data output terminals and command input terminals. X-address signals input through the external input/output terminals I/O0 through I/O7 are supplied to an X-address buffer 408 through a multiplexer 407. An X-address decoder 409 decodes internal complementary address signals output by the X-address buffer 408 to drive the word lines.

Although not shown, the memory mats included in the memory array 403 are configured on the left and right of the sense latch circuit array. Specifically, precharge circuits, bit lines and the like are provided at both of the input and output nodes of the sense latch circuits. The bit lines 405 are selected based on a selection signal output by a Y-address decoder 411 by Y gate array circuit 413. Y-address signals input through the external input/output terminals I/O0 through I/O7 are preset in a Y-address counter 412, and address signals which are sequential increments starting with the preset values are supplied to the Y-address decoder 411.

A bit line selected by a Y gate array circuit 413 is conducted to an input terminal of an output buffer 415 during a data output operation and is conducted to an output terminal of an input buffer 417 through a data control circuit 416 during a data input operation. The connection between the output buffer 415, input buffer 417 and input/output terminals I/O0 through I/O7 is controlled by the multiplexer 407. Commands supplied through the input/output terminals I/O0 through I/O7 are supplied to a mode control circuit 418 through the multiplexer 407 and input buffer 417. The data control circuit 416 is capable of supplying the memory array 403 with not only data supplied through the input/output terminals I/O0 through I/O7 but also data having logical values in accordance with the control of the mode control circuit 418.

A control signal buffer circuit 419 is supplied with a chip enable signal CEb, an output enable signal OEb, a write enable signal WEb, a serial clock signal SC, a reset signal RESb and a command enable signal CDEb as access control signals.

The mode control circuit 418 controls a function of interfacing external signals according to the states of those signals and controls internal operations according to command codes. When a command or data is input to the input/output terminals I/O0 through I/O7, the signal CDEb is asserted; the signal WEb is asserted further if it is a command; and the signal WEb is negated if it is data. When an address is input, the signal CDEb is negated and the signal WEb is asserted. This allows the mode control circuit 418 to discriminate between commands, data and addresses input through the external input/output terminals I/O0 through I/O7 on a multiplex basis. During an erase or write operation, the mode control circuit 418 can externally indicate such a state by asserting a ready/busy signal R/Bb.

An internal power supply circuit 420 generates various operating power supplies 421 for purposes such as write, erase verify and read and supplies them to the X-address decoder 409 and memory cell array 403.

The mode control circuit 418 controls the flash memory 4 as a whole according to commands. The operation of the flash memory 4 is basically determined by the commands.

The commands allocated to the flash memory include, for example, read, erase and write commands. The read command is constituted by a first command, and the other commands are constituted by a first command and a second command.

The flash memory 4 has a status register 423 for indicating the internal status thereof, and the contents of the same can be read through the input/output terminals I/O0 through I/O7 when the signal OEb is asserted.

When a write operation is instructed by the write command, the sense latch circuits can latch write data supplied through the Y gate array circuit 413. In this example, since the flash memory 4 has the input/output terminals I/O0 through I/O7 for eight bits, write data can be set in eight sense latch circuits at one cycle of input of write data. In the context of this description, since writing is performed on a word line basis, a write voltage is applied to cause a write operation after write data are set in sense latch circuits associated with the bit lines of all memory cells whose selection terminals are coupled to one word line. At a write operation, for example, all bit lines are precharged to a predetermined level in advance; the bit lines of memory cells selected for writing are discharged down to a ground potential; and the bit lines of memory cells unselected for writing are maintained at the precharge level. When a high write voltage is applied to word lines selected for writing, a high voltage is applied between the control gates and drains of the memory cells selected for writing to increase the threshold voltage of the memory cells selected for writing, which realizes a write state. Prior to a write operation, the memory cells are in an erase state in which the threshold voltage is low. The threshold voltages for write and erase may be defined reversely.

The reset signal RESb in FIG. 16 is a signal that corresponds to the reset signal RES3 in FIG. 1. The multiplexer 407 and control signal buffer circuit 419 in FIG. 16 exchange input/output signals with the FCL 13 in FIG. 1.

Figure 17:
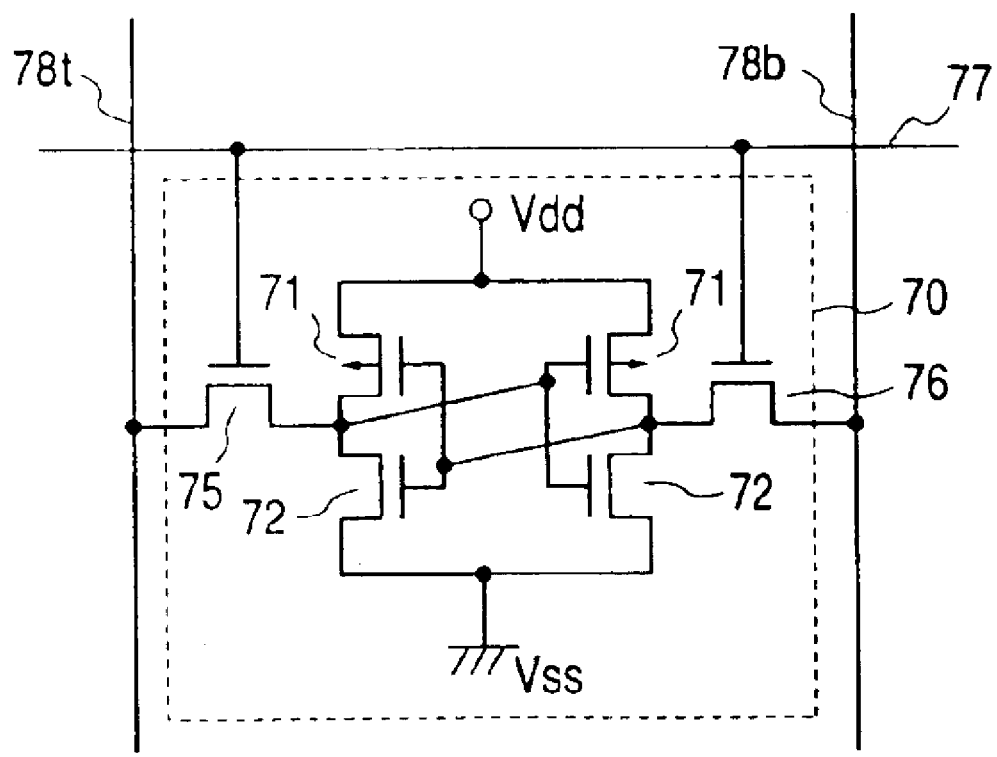
FIG. 17 is a circuit diagram of an example of a static memory cell.

A description will now be made on an example of static memory cells that constitute the integrated SRAM 35, work RAM 8 and buffer RAM 7. FIG. 17 one typical static memory cell 70. The static memory cell 70 has a pair of CMOS inverters formed by an n-channel type MOS transistor 71 and a p-channel type MOS transistor 72, and an input terminal of one of the CMOS inverters is cross-coupled to an output terminal of the other CMOS inverter to form a static latch. A pair of storage nodes of the static latch are coupled to complementary bit lines 78t and 78b through n-channel type selections MOS transistors 75 and 76. The gates of the selection MOS transistors 75 and 76 are coupled to a word line 77.

While the invention conceived by the inventor has been specifically described based on preferred embodiments thereof, the invention is not limited to the embodiments and may obviously modified in various ways without departing from the principle of the invention.

For example, the program stored in the buffer memory is not limited to a program for testing or debugging and may be a file data compression program or the like. The term "memory card" in the context of the present specification is not meant to exclude other functions, and it is used on an assumption that a memory card at least has a function of storing file data and may include communication interface functions such as those of MODEMs and TAs (terminal adapters), networking functions such as that of LANs (local area networks), video capture functions, voice recognizing functions and the like. Therefore, programs used for such functions may be stored in the buffer memory.

The programmable area is not limited to a partial storage area of the buffer memory, and it may be the entire area of the same.

The above-described commands and data are not limited to serial signals and may be parallel signals.

The cluster size is not limited to four sectors and may be appropriately determined in accordance with the configuration of the memory mats of the flash memory, the storage capacity of the integrated SRAM that develops the management table and the like.

The term "microcomputer" implies logic circuit units having a function of fetching and executing instructions and does not limit the invention to configurations in which a single microcomputer uses verified design data of an LSI associated therewith. The microcomputer may be a circuit having a new customized design.

The memory card LSI has been described as a single chip. The single chip configuration is expected to provide a higher operating speed and lower power consumption in comparison to multi-chip configurations.

Effects that can be achieved by typical aspects of the invention disclosed in this application can be summarized as follows.

Since a buffer memory used for writing and reading file data can be also used as a program memory, separate programs for purposes such as testing or debugging can be executed using the buffer memory without any additional program memory. In a memory card constituted by a single chip, even when a random increase of the storage capacity of the ROM is inhibited by limitations on the chip size and the like, programs for purposes including debugging or testing can be executed within the limitations. Further, referring to control over the transfer of an extended program to the buffer memory, since the transfer of an extended program externally supplied or stored in an integrated flash memory can be controlled by the file memory itself, the file memory has preferable usability with respect to an extended program.

What is claimed is:

1. A nonvolatile memory apparatus comprising:
a plurality of terminals including a clock terminal, a command terminal and a data terminal;
a central processing unit;
a first nonvolatile memory;
a second nonvolatile memory; and
a volatile memory,
wherein said clock terminal is capable of receiving a clock signal,
wherein said command terminal is capable of receiving an arbitrary one command of a plurality of commands, each of which is for specifying a corresponding operation of said nonvolatile memory apparatus therein, and is capable of outputting a plurality of responses each of which corresponds to a received command,
wherein said data terminal is capable of receiving data and outputting data,
wherein said first nonvolatile memory stores a first program,
wherein said second nonvolatile memory stores data received from said data terminal and is further capable of storing a second program which is read out from said second nonvolatile memory to said volatile memory,
wherein said central processing unit reads out said first program from said first nonvolatile memory and executes said first program in response to receiving a first command received from said command terminal, and
wherein said central processing unit reads out said second program from said volatile memory and executes said second program, in response to receiving a second command received from said command terminal.

2. A nonvolatile memory apparatus according to claim 1, wherein in response to receiving a data write command that is said first command, said central processing unit controls, by executing said first program, receiving of data from said data terminal to said volatile memory and storing data stored in said volatile memory to said second nonvolatile memory.

3. A nonvolatile memory apparatus according to claim 2, wherein said volatile memory is assigned in a part of an address space which is accessible by said central processing unit.

4. A nonvolatile memory apparatus according to claim 3, further comprising a second volatile memory, wherein said second volatile memory is assigned in another part of said address space, and stores a vector table for storing branch addresses.

5. A nonvolatile memory apparatus according to claim 2, wherein said second program is a compression program for compressing data stored in said second nonvolatile memory.

6. A nonvolatile memory apparatus according to claim 5, further having a communication function, wherein said second program is used for said communication function.

7. A nonvolatile memory apparatus comprising:
a program ROM;
a control circuit;
a volatile memory; and
a nonvolatile memory,
wherein said program ROM stores a first program which includes a data writing program,
wherein said nonvolatile memory is capable of storing file data executed said data writing program by said control circuit in response to a first command indicating a data writing function, and stores a second program therein, and wherein said control circuit controls reading out of said second program to said volatile memory for operating a communication function in response to a second command.

8. A nonvolatile memory apparatus according to claim 7, further comprising a data terminal, wherein said data terminal is capable of receiving data in parallel.

9. A nonvolatile memory apparatus according to claim 8, wherein said program ROM stores a vector table storing a plurality of program addresses each of which indicates said first program and said second program respectively,
wherein in response to receiving a command, said control circuit fetches a program address in said vector table corresponding to said received command.

10. A nonvolatile memory apparatus according to claim 9, further comprising a second volatile memory, wherein said second volatile memory stores a management table for managing said nonvolatile memory.

11. A nonvolatile memory apparatus according to claim 10, wherein said volatile memory and said second volatile memory are structured by SRAM.

12. A nonvolatile memory apparatus according to claim 7, wherein said control circuit controls storing a program to said nonvolatile memory.

13. A nonvolatile memory apparatus according to claim 7, wherein said volatile memory is a part of a buffer memory, wherein said buffer memory is capable of using temporarily stored data at data inputting and data outputting.

14. A nonvolatile memory apparatus comprising:
a random access memory;
a read only memory;
a nonvolatile memory;
a central processing unit; and
an address table,
wherein said read only memory comprises a first program step for performing a first operation of the nonvolatile memory apparatus therein in accordance with a first command received from outside of the nonvolatile memory apparatus,
wherein said nonvolatile memory is capable of storing data and is capable of storing a second program step, which second program step is for performing a second operation of the nonvolatile memory apparatus therein,
wherein said random access memory is capable of storing said second program step read out from said nonvolatile memory,
wherein said address table indicates an allocated address of said second program step in said random access memory,
wherein said central processing unit executes said first program step when said first command is received, and
wherein said central processing unit fetches said allocated address of said second program step from said address table and executes said second program step, when a command in accordance with said second operation is received from outside of the nonvolatile memory apparatus.

15. A nonvolatile memory apparatus according to claim 14,
wherein said address table further indicates an allocated address of said first program steps stored in said read only memory.

16. A nonvolatile memory apparatus according to claim 15,
   wherein said random access memory is capable of storing data received from outside and is capable of storing data for outputting to outside.

17. A nonvolatile memory apparatus according to claim 16,
   wherein said address table is stored in said read only memory, and
   wherein said second program is located according to said allocated address of said second program step in said address table.

18. A nonvolatile memory apparatus comprising:
   a random access memory;
   a read only memory;
   a nonvolatile memory;
   a central processing unit; and
   an address table,
   wherein said read only memory comprises first operation steps for performing a first operation of the nonvolatile memory apparatus therein in accordance with a first command received from outside of the nonvolatile memory apparatus,
   wherein said nonvolatile memory is capable of storing data,
   wherein said random access memory is capable of storing second operation steps,
   wherein said address table indicates an allocated address of said second operation steps in said random access memory,
   wherein said central processing unit executes said first operation steps when said first command is received, and
   wherein said central processing unit fetches said allocated address of said second operation steps from said address table and executes said second operation steps, when a command in accordance with said second operation is received from outside of the nonvolatile memory apparatus therein.

19. A nonvolatile memory apparatus according to claim 18,
   wherein said address table further indicates an allocated address of said first operation steps stored in said read only memory.

20. A nonvolatile memory apparatus according to claim 19,
   wherein said random access memory is capable of storing data received from outside and is capable of storing data for outputting to outside.

21. A nonvolatile memory apparatus according to claim 20,
   wherein said address table is stored in said read only memory, and
   wherein said second program is located according to said allocated address of said operation steps in said address table.

22. A nonvolatile memory apparatus comprising:
   a read only memory;
   a random access memory;
   a nonvolatile memory;
   a processing unit; and
   an address table,
   wherein said read only memory stores first program steps,
   wherein said nonvolatile memory is capable of storing data and is capable of storing second program steps,
   wherein said random access memory is capable of storing said second program steps read out from said nonvolatile memory,
   wherein said address table comprises a plurality of entries, wherein a first entry of said plurality of entries stores a first allocated address which indicates an allocated address of said first program steps in said read only memory, and wherein a second entry of said plurality of entries stores a second allocated address which indicates an allocated address of said second program steps in said random access memory,
   wherein said processing unit decodes a command received from outside, and fetches said first allocated address from said first entry of said plurality of entries when said processing unit performs a first operation in accordance with said first program steps, or fetches said second allocated address from said second entry of said plurality of entries when said processing unit performs a second operation in accordance with said second program steps.

23. A nonvolatile memory apparatus according to claim 22,
   wherein said processing unit chooses one entry of said first entry and said second entry for fetching allocated address of program steps in accordance with a result of decoding said command received from outside.

24. A nonvolatile memory apparatus according to claim 23,
   wherein said processing unit comprises a decoder circuit and an interrupt control circuit,
   wherein said decoder circuit decodes commands and issues an interrupt signal in accordance with said command to said interrupt control circuit, and
   wherein said interrupt control circuit chooses one entry of said first entry and said second entry based on said interrupt signal.

25. A nonvolatile memory apparatus according to claim 24,
   wherein said random access memory is capable of storing data received from outside or is capable of storing data for outputting to outside.

26. A nonvolatile memory apparatus according to claim 25,
   wherein said address table is stored in said read only memory, and
   wherein said second program is located according to said second allocated address entered in said address table.

27. A nonvolatile memory apparatus comprising:
   a nonvolatile memory array having a plurality of memory cells, each of which is capable of data erasing electrically and is capable of data programming electrically;
   a volatile memory having a first memory area and a second memory area; and
   a control circuit having a program memory,
   wherein said control circuit is capable of performing arbitary one of operations in response to a received command by excuting operation steps,
   wherein in a read operation in response to receiving a read command, by excuting first operation steps for performing said read operation read out from said program memory, said control circuit controls to reading a first data from ones of said plurality of memory cells of said nonvolatile memory array, storing said first data into said first memory area of said volatile memory, and outputting said first data stored into said first memory area, wherein a write operation in response to receiving a write command, by excuting second operation steps for performing said write operation read out from said program memory, said control circuit controls to receiving second data, storing said second data into said first memory area of said volatile memory, and writing said second data into ones of said plurality of memory cells of said nonvolatile memory array, and wherein said control circuit executes third operation steps for performing a first operation read out from said second memory area of said volatile memory.

28. A nonvolatile memory apparatus according to claim 27, wherein said third operation steps stored into said second memory area of said volatile memory is read out from said nonvolatile memory array before performing said first operation.

29. A nonvolatile memory apparatus according to claim 28, wherein said first operation is a testing operation thereof.

30. A nonvolatile memory apparatus according to claim 28, wherein said first operation is a communication interface operation thereof.

31. A nonvolatile memory apparatus comprising:

a nonvolatile memory array;

a control circuit coupled to said nonvolatile memory array by an input/output signal line, and a command enable signal line, said input/output signal line is used for data inputting/outputting, an address inputting, and a command inputting; and said command enable signal line is used for indicating whether command inputting has occurred or not via said input/output signal line;

a volatile memory having a first memory area and a second memory area; and a plurality of terminals having a data input/output terminal, a command input terminal, and a clock terminal, wherein said data input/output terminal is used for data inputting or data outputting, said command input terminal is used for host command inputting and command response outputting, and said clock terminal is used for clock signal inputting, wherein said control circuit has a program memory, which is structured as a nonvolatile memory, and performs a first operation by excuting first operation steps stored in said program memory, wherein said nonvolatile memory is capable of storing data and a second operation steps, wherein said control circuit performs said first operation in accordance with a first command received from said command input terminal as a host command for accessing data of said nonvolatile memory via memory area of said volatile memory, wherein said control circuit performs a second operation by excuting said second operation steps read from said second memory area of said volatile memory, and wherein said control circuit reads out said second operation steps from said nonvolatile memory to said second memory area of said volatile memory before performing said second operation via said input/output signal line.

32. A nonvolatile memory apparatus according to claim 31, wherein said control circuit issue arbitrary one of memory commands which includes a read command, and a write command, wherein in a read operation in accordance with a read command received from said command input terminal as said host command, said control circuit controls, by executing operation steps in accordance with said read command read out from said program memory, to issuing said read command to said nonvolatile memory array via said input/output signal line, receiving said data from said nonvolatile memory stored therein via said input/output signal line, and storing said data to said first memory area of said volatile memory, wherein in a write operation in accordance with a write command received from said command input terminal as said host command, said control circuit controls, by executing operation steps in accordance with said write command read out from said program memory, to receiving data via said data input/output terminal, to storing said data to said first memory area of said volatile memory, to issuing said write command to said nonvolatile memory array via said input/output signal line, and transferring data to said nonvolatile memory array via said input/output signal line for storing data into said nonvolatile memory array.

33. A nonvolatile memory apparatus according to claim 32, wherein in a test operation in accordance with a test command received from said command input terminal as said host command, said control circuit controls, by executing operation steps in accordance with said test command read out from said second memory are of said volatile memory, to testing thereof.

* * * * *

UNITED STATES PATENT AND TRADEMARK OFFICE
CERTIFICATE OF CORRECTION

PATENT NO.        : 7,002,853 B2                                    Page 1 of 1
APPLICATION NO.   : 10/874381
DATED             : February 21, 2006
INVENTOR(S)       : Kozakai et al.

It is certified that error appears in the above-identified patent and that said Letters Patent is hereby corrected as shown below:

ON THE TITLE PAGE

Please correct (65) Related U.S. Application Data to read as follows:

(65) Continuation of application No. 10/654,957, filed Sep. 5, 2003, (now abandoned), which is a continuation of application No. 09/495,955, filed Feb. 2, 2002, now Pat. No. 6,643,725

Signed and Sealed this

Eighteenth Day of July, 2006

JON W. DUDAS
*Director of the United States Patent and Trademark Office*